United States Patent [19]
Lee

[11] Patent Number: 5,311,931
[45] Date of Patent: May 17, 1994

[54] MIST SUPERCOOLING OF A HEATED SURFACE

[75] Inventor: Richard S. L. Lee, St. James, N.Y.

[73] Assignee: The Research Foundation of State University of New York, Albany, N.Y.

[21] Appl. No.: 815,282

[22] Filed: Dec. 27, 1991

[51] Int. Cl.$^5$ .................. F28F 13/12; F28F 25/06
[52] U.S. Cl. .................. 165/109.1; 62/121; 62/304; 62/314; 165/111; 165/903; 165/908; 165/911; 361/694; 361/700
[58] Field of Search .............. 165/109.1, 911, 908, 165/903, 111; 62/304, 314, 316; 361/384, 385

[56] References Cited

U.S. PATENT DOCUMENTS

| | | | |
|---|---|---|---|
| 2,901,893 | 9/1959 | Saltzman | 62/316 |
| 2,906,103 | 9/1959 | Saltzman | 62/314 |
| 3,997,376 | 12/1976 | Hemsath et al. | 62/64 |

OTHER PUBLICATIONS

Perkins, J. S. et al, *Mixing Enhancement In Flow Past Rectangular Cavities...*, IEEE Transactions...Technology vol. 12, No. 4, Dec. 1989 pp. 766-771.

Lee, S. L. "A Combined Experimental and Theoretical Study of Mist Cooling of a Heated Surface", pp. 1-18, Dec. 1984, U.S.A.

Sachar, K. S. "Liquid Jet Cooling of Integrated Circuit Chips IBM Technical Disclosure Bulletin", vol. 20, No. 9, pp. 3727-3728, Feb. 1978.

Wieghardt, "Erhöhung des turbelenten Reibungswider-standes durch Oberflächenstörungen in 2 Forschft Schiffstech", pp. 65-81, 1953, Germany.

*Primary Examiner*—Albert W. Davis, Jr.
*Attorney, Agent, or Firm*—Hoffman & Baron

[57] ABSTRACT

A method for the efficient cooling of a cavity-bearing surface is disclosed. The method includes the provision of an extra-fine coolant mist to the surface to be cooled wherein the surface has at least two projections and at least one cavity therebetween. The mist is deposited so as to form an ultra-thin coolant film upon the surface and at least one coolant mist vortex within the cavity. The film is evaporated from its outside surface.

12 Claims, 8 Drawing Sheets

MIST SUPERCOOLING OF A HEATED SURFACE

BACKGROUND OF THE INVENTION

The present invention relates to increasing the efficiency of cooling of a heated surface.

Currently, great efforts are being made to increase the operating capabilities of computers. One of the elements limiting the speed and efficiency of computers is heat build-up. The efficient and uniform cooling of electronic components is one of the most crucial limiting factors in the design and operation of modern electronic devices. For example, one of the factors limiting the speed and efficiency of operation of computers is the computer chip temperature (i.e., the efficiency and speed decrease as the temperature of the computer chip rises). Accordingly, tremendous efforts have been made to remove heat from computers and computer chips so as to increase their operating capabilities.

The current technology for the cooling of electronic components is basically restricted to convective cooling using a single-phase fluid (gas or liquid). In convective cooling, the driving force for heat transfer is the temperature difference between the fluid and the heated surface.

Conventional single-phase convection cooling does not provide high heat flux while, at the same time, maintaining a low surface temperature of the object cooled. The dual objectives of high heat flux and low surface temperature are essential for the development of future generations of ever more powerful computer chips.

One way to increase heat flux is through the use of liquid convective cooling with boiling. Unfortunately, the surface temperature must remain high for boiling to occur. Another problem with liquid convective boiling is the hysteresis of incipient boiling temperature overshoot. Hysteresis of incipient boiling temperature overshoot is particularly a problem when dielectric fluorocarbon liquids are used as the working medium.

An additional problem with boiling is its discrete nature in both space and time (for example, nucleate boiling) which can result in the non-uniform cooling of the circuit board and the undesirable consequence of creating an increase in the level of electronic noise.

Another method of cooling includes the placing of an electronic circuit board in an enclosure filled with a heat-conducting liquid. Heat is conducted from the chips through the heat-conducting liquid, and in some instances also through the heat-conducting structure, to an outside surface which in turn is to be cooled by conventional single-phase convective cooling. Unfortunately, this method suffers from the aforementioned shortcomings of conventional single-phase convective cooling.

A research proposal to the National Science Foundation entitled, "A Combined Experimental and Theoretical Study of Mist Cooling of a Heated Surface" was released in December of 1984. The publication disclosed the cooling of a flat heated surface by the evaporation of a liquid film from the heated surface, which was maintained by the deposition of droplets from a mist flow. However, the disclosed cooling is limited to flat surfaces.

In 1978, an IBM Technical Disclosure Bulletin disclosed a method of cooling integrated circuit chips by the application of a liquid jet to a deflector in contact with the integrated circuit chip. The deflector has a concave area in which the liquid jet impinges. The jet strikes the deflector, spreads radially outward and forms a thin film region which changes into a thick, slowly moving layer as it approaches the outer region of the deflector. The jet system cools an array of chips. The nozzles of the jet system are fed from a common manifold and the nozzle diameters are chosen to reflect the heat transfer requirements for individual chips. Relatively narrow orifices may be used for low heat dissipation and relatively wide orifices may be used for high heat dissipation. However, the amount of heat removed by the device disclosed in the IBM Technical Bulletin is limited. Further, the use of a deflector requires special manufacturing techniques and increases the costs of manufacture.

U.S. Pat. No. 3,887,759 to Staub discloses an evaporative cooling system employing liquid film evaporation from a grooved evaporative service. In the system, a vaporization chamber houses the apparatus to be cooled (for example, a transformer). The film of liquid flows over a heated surface of the apparatus and is evaporated thereby, cooling the apparatus. The film receives fluid from condenser tube openings which drip fluid onto the surface to be cooled. The surface of the apparatus has shallow grooves which stabilize the distribution of the flowing liquid so that all sections of the surface are maintained in a wet condition by the flowing film. The grooves maintain the film of liquid intact so that the film will not break into rivulets (as would be the case with a smooth surface), thereby preventing rupture of the film. However, the system of Staub requires the use of a grooved evaporative surface and a vaporization chamber. Hence, the unit of Staub is bulky and requires special manufacturing techniques which, in turn, increases the cost. Further, the system of Staub cannot simultaneously provide a high heat flux combined with a low surface temperature.

U.S. Pat. No. 3,794,886 to Goldman discloses a fluid-cooled semiconductor socket. The semiconductor device is placed in contact with a thermally-conductive plate which conducts heat away from the semiconductor chip. The semiconductor chip is in thermally-conductive contact with a portion of the semiconductor case which contacts the surface of the plate. A thermally-conductive fluid conduit is attached to the plate on a face directly opposite from the semiconductor chip. The conduit is placed so as to maximize thermal conductivity between the point where it is placed on the plate and the semiconductor chip. The fluid flowing through the conduit absorbs and conducts away heat produced by the semiconductor chip. However, the device of Goldman is inefficient, requires the use of a fluid flowing through the conduit to remove heat and generally suffers the drawbacks associated with single phase convective cooling.

U.S. Pat. No. 4,109,707 to Wilson, et al. discloses a fluid-cooling system for electronic systems particularly adapted to cool large scale integrated circuit chips mounted on substrates. The system has one or more heat exchangers through which a liquid coolant is circulated. Each heat exchanger has a flexible wall and is mounted so that its flexible wall is in close proximity to a surface of a substrate to be cooled. The heat exchange medium includes silicon oil, ethylene glycol, freon and water. However, the device of Wilson, et al. is a single-phase liquid cooling system and hence, cannot provide a high heat flux in combination with a low surface temperature.

It is, therefore, an object of the present invention to provide an efficient and inexpensive method for the cooling of computer chips as well as all other heated surfaces having cavities.

Other and further objects will become apparent to those skilled in the art upon reading the present specification, and it is not intended in any way to restrict the scope of the invention by setting forth the objects above.

SUMMARY OF THE INVENTION

These and other objects are achieved by the present invention which provides an apparatus and method for the cooling of a heated surface.

In the method of the present invention, a coolant mist is provided to a heated surface. The surface is characterized as having relatively severe relief characteristics, including at least one cavity. Projections can also be included on the surface. The coolant mist is imposed on the surface such that at least one coolant mist vortex is formed within the cavity. The deposition of fine droplets from the mist forms an ultra-thin liquid film on the surface Heat from the surface causes the film to evaporate, thereby cooling the surface.

Almost any liquid may be used with the present invention. Mist-forming liquids suitable for use with the present invention include water, trichloromonofluoromethane (Freon 11 TM), and dichlorodifluomethane (Freon 12 TM).

In a preferred embodiment, the rate of evaporation of the liquid film is approximately equal to the rate of deposition of droplets onto the film on the heated surface.

In another preferred embodiment, the evaporated film is captured and cooled, recycled into a cooling mist, and redeposited onto the heated surface.

The apparatus of the present invention includes a means for providing the cooling mist to the surface of the element to be cooled. The device which can include an atomizer, must form droplets of a size sufficient to permit formation of a mist vortex.

In a preferred embodiment the apparatus includes a means, such as a flow control valve, for regulating the rate of contacting of the mist with the surface.

The apparatus can also include the surface to be cooled in combination with the unique mist-vortex-forming components. This surface will include the projections and cavities, such cavities having a width and depth sufficient to permit formation of at least one mist vortex therein. It has been found that cavities having dimensions such that the ratio of the width to the depth of the cavity is from about 0.67 to about 2.0 will permit formation of a single mist vortex within the cavity.

The device can include a means for aiding the flow of the mist along the surface to be cooled, such as a fan or a source of compressed air.

The surface and the mist provision means are preferably enclosed in an insulated container so that all elements can be controlled, e.g., mass concentration of mist, velocity of mist, recovery of evaporated liquid, etc.

An advantage of the present invention is that it provides an inexpensive method for the cooling of heat-producing devices having otherwise difficult to cool surfaces.

A further advantage of the present invention is that it provides a method of cooling which simultaneously provides a very high heat flux and a very low surface temperature.

An additional advantage of the present invention is that in many cases the present invention can be used without structural alteration of the surface to be cooled.

A still further advantage of the present invention is that a heat flux in the hundreds of kW/m2 can be easily achieved coupled with a surface temperature of as low as a few degrees centrigrade.

For a better understanding of the present invention, reference is made to the following description, taken in conjunction with the following figures, and its scope will be set forth in the claims.

DETAILED DESCRIPTION OF THE PREFERRED EMBODIMENTS

As used herein, supercooling is defined as the simultaneous attainment of high heat flux and low temperature of the surface to be cooled. The present invention achieves supercooling by the continuous evaporation of liquid from the outside surface of an ultra-thin liquid film on a non-planar surface to be cooled.

The present invention includes a method for the cooling of a non-planar surface having at least two projections and at least one cavity therebetween. The present invention is primarily directed toward the supercooling of surfaces on which computer chips are affixed. However, the present invention can also be used with heat exchangers, chemical process equipment, combustors, cooling systems for digital computers and telecommunications equipment, continuous laser cavities and other devices having cavities capable of forming a mist vortex. Devices may be adapted for use with the present invention by the attachment of heat fins to the surface to be cooled to form cavities of the specified dimensions.

Fluid flow and heat transfer problems over a cavity-bearing surface are relevant to a number of engineering applications where a heated surface is extended by appendages connected to the heated surface for heat transfer improvement. The phenomenon of the resulting separated flow occurs in heat exchangers, chemical process equipment, combustors, cooling systems for digital computers and telecommunication equipment, high-performance propulsion systems such as the ramjet engine, continuous laser cavities and housings for optical instruments in space vehicles. However, it has been found that convective heat transfer per unit area on the walls of a cavity by a single-phase air or gas flow is usually an order of magnitude lower than the heat transfer per unit area on a flat wall.

The flow of mist droplets upon a non-planar surface having projections and cavities therebetween is not parallel to the surface. The droplets interact with the relief pattern of the non-planar surface. The flow pattern is different and the droplets interact differently than would be the case with a flat surface. The flow circles around in the cavities at two levels. The first level is a gross level of circulation which deviates from a parallel pattern to create undulations conforming to the projections and the cavities between the projections. The second level is a fine level of circulation confined primarily within the spatial dimension of the cavities. Surprisingly, it has been discovered that the heat transfer can be greatly improved due to the creation of the change in mist circulation flow.

Figure 1B:
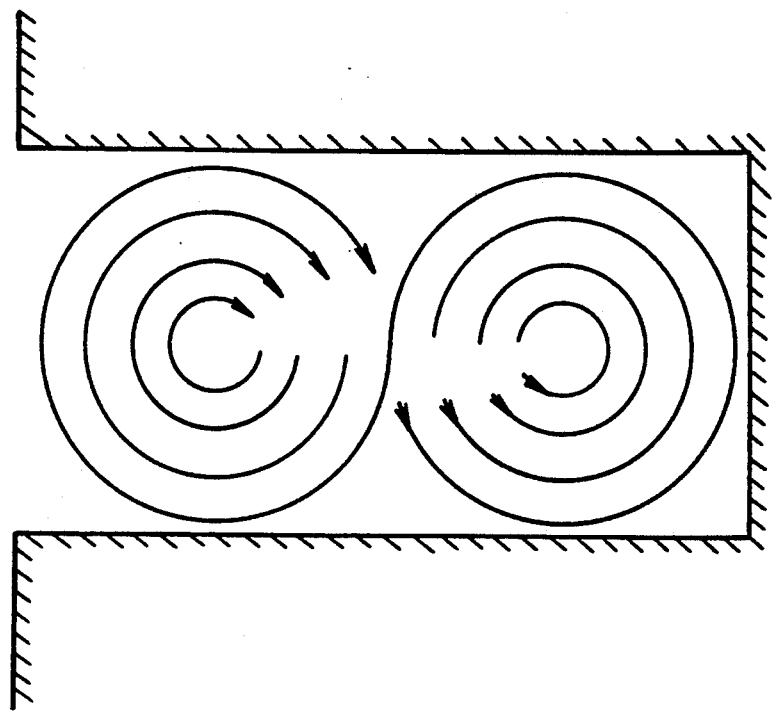
FIG. 1(b) illustrates the production of multiple vortexes within a cavity.
Figure 1A:
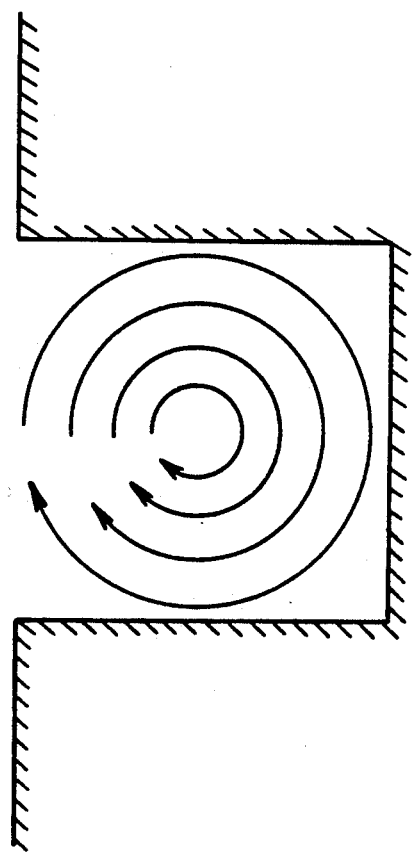
FIG. 1(a) illustrates a primary mist vortex produced within a cavity of a heated surface by the method of the present invention.
Figure 2A:
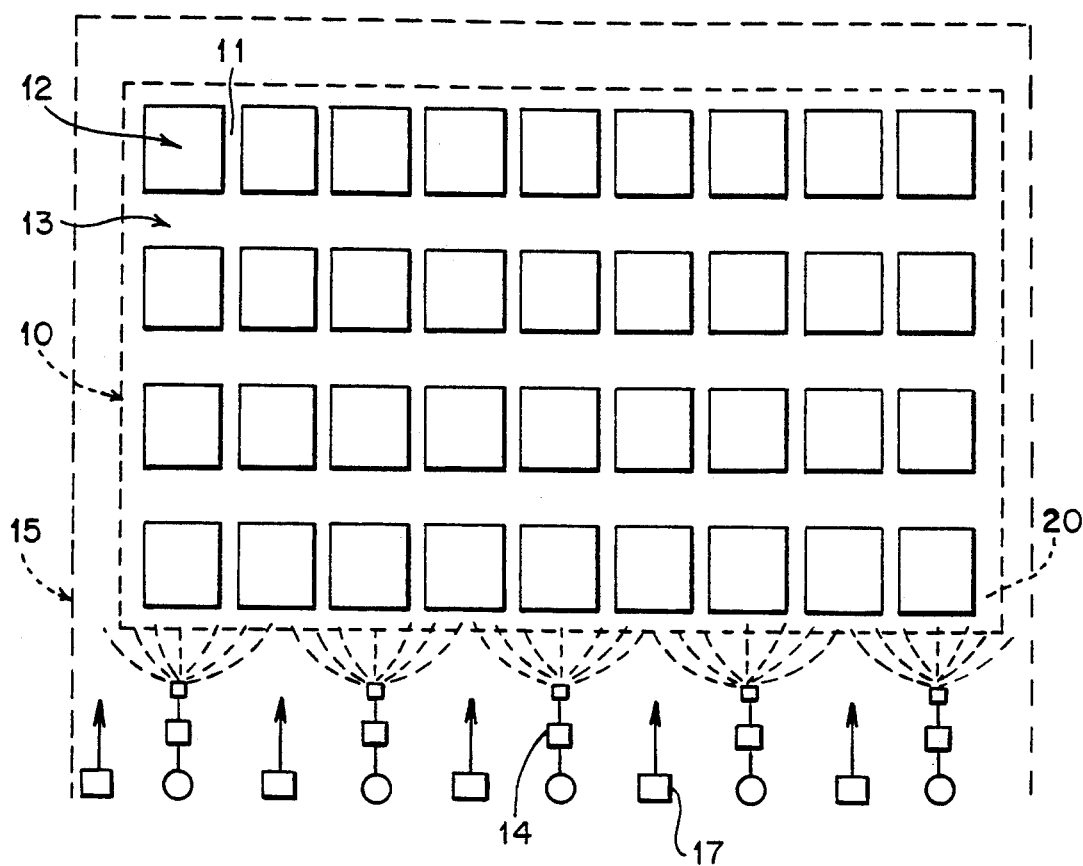
FIG. 2(a) is a front view of the simulated chip board and insulated container (illustrated in phantom) of the present invention.
Figure 2B:
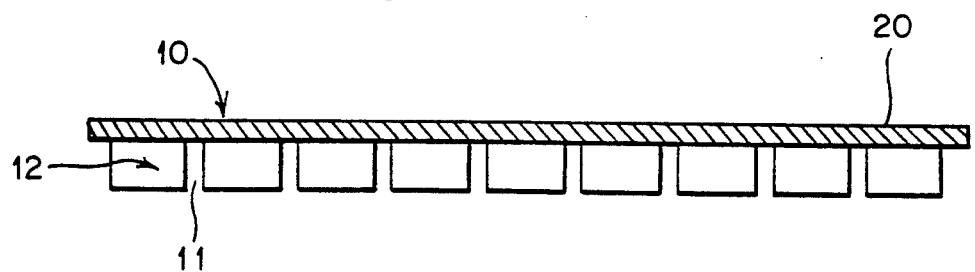
FIG. 2(b) is a top view of a simulated chip board used to demonstrate the advantages of the present invention.
Figure 2C:
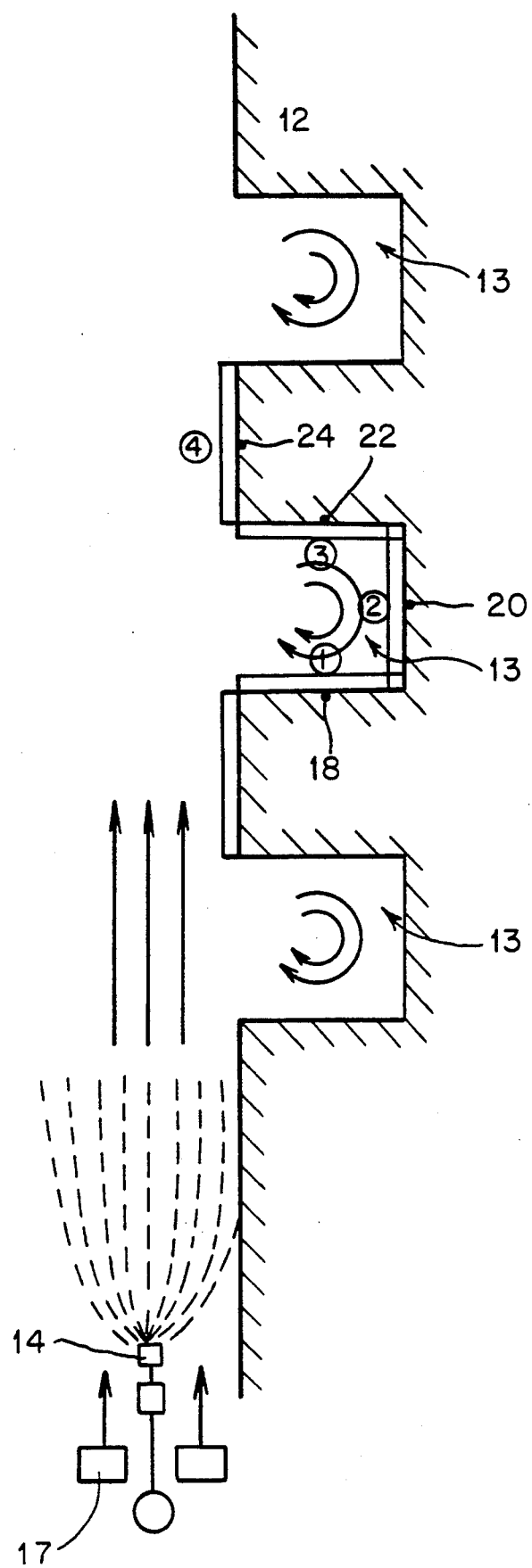
FIG. 2(c) is an enlarged cross-sectional side view of the simulated chip board of FIG. 2(a).

The ratio of the width (b) to the depth (h) of the cavity (b/h ratio) determines whether the flow within the cavity takes the form of a primary vortex as illustrated in FIGS. 1(a) and 2(c), or the form of longitudinally placed multiple vortices as illustrated in FIG. 1(b). To form a primary vortex, the b/h ratio is preferably from about 0.67 to about 2.0. The formation of a primary mist vortex within a cavity results in a more efficient removal of heat.

For a single-phase air flow, it has previously been observed that a b/h ratio of approximately 0.67 to approximately 2.0 produces a single vortex flow with the vortex center located near the cavity center, Dr. K. Wieghardt, "Erhöhung des turbulenten Reibungswiderstandes durch Oberflächenstörungen", 1953. However, the Wieghardt disclosure is concerned with turbulent drag. Wieghardt does not address any aspect of cooling a surface.

The liquid must have the ability to form droplets of a size which are small enough to be carried within a vortex inside the cavity. The vortex will aid in the deposition of droplets and the formation of an ultra-thin liquid film on the heated cavity walls. Accordingly, almost any liquid may be used for heat transfer purposes with the present invention. Such liquids include water, Freon 11 ™ (trichloromonofluoromethane), Freon 12 ™ (dichlorodifluomethane), etc. However, for a particular application, a suitable liquid will be selected based on its chemical compatibility with the surface material of the heated surface to be cooled. For example, it is preferred that the coolant not have a corrosive effect upon the surface to be cooled.

The mass concentration of liquid droplets in the mist, the film thickness, the liquid coolant, droplet size, flow velocity and the heat flux can vary depending upon the individual circumstances. It is the combination of these factors which collectively define the criterion for the establishment and maintenance of an ultra-thin liquid film on a heated surface for supercooling by use of a mist flow.

The ultra-thin liquid film is maintained by the continuous deposition of extra-fine liquid droplets from the mist. Preferably, the amount of liquid being deposited upon the surface is approximately equal to the amount being evaporated from the surface.

The evaporated liquid may be captured and cooled. The cooled liquid would then be recycled into a cooling mist which would be redeposited onto the heated surface as previously described.

The principal physical cooling phenomenon is mass transfer. The heated surface is quenched uniformly in both space and time resulting in extremely low, reasonably uniform and steady surface temperatures and a large heat flux from the heated surface.

When using water as the coolant, the mass concentration of the droplets in the mist will preferably be from about 0.01 kg/m$^3$ to about 0.15 kg/m$^3$, the mist velocity will preferably be from about 5 to about 30 meters per second, the droplets will preferably range in diameter from about 18 to about 120 $\mu$m and the film will preferably be from about 10 to about 100 $\mu$m thick. The water droplets will most preferably be about 30 to about 80 $\mu$m in diameter and the water film thickness will most preferably be about 100 $\mu$m thick.

The mist velocity for a water droplet mist is preferably 20 meters per second or greater. At velocities of less than 20 meters per second the water film may not be maintained on all surfaces at the preferred thickness. The minimal velocity required to maintain the film will vary depending upon the coolant used and the heat flux. Generally, the rate of heat transfer will increase with an increase in the mist velocity The mist velocity may be varied, for example, by using a source of compressed air or a fan.

The only limitations upon droplet size is that the droplets must be of sufficient size to permit formation of a film on the surface to be cooled such that the liquid film is evaporated from its outside surface and the droplets must also be of a size sufficiently small to permit formation of a mist vortex.

EXAMPLES

A simulated chip board 10 was constructed as illustrated in FIGS. 2(a), 2(b) and 2(c). The dimensions and geometries of the simulated chips closely resemble those of the most commonly used chips. The simulated chips 12 of the first simulated chip board were 30 mm long by 15 mm wide by 6 mm deep, and arranged in rows with a chip-to-chip gap of 3 mm and a row-to-row separation of 10 mm. The cavities 13 therebetween had a depth (h) of 6 mm and width (b) of 10 mm. The b/h ratio was 10/6 or approximately 1.67. The simulated chips 12 rested upon an insulation plate 20. The primary surfaces of the simulated chips 12 were each covered by 0.2 mm of stainless steel. The simulated chips 12 were heated by applying an electric current to the stainless steel covering the surfaces of the simulated chips 12. In a preferred embodiment, an insulated container 15 will enclose the system.

A coolant mist was upwardly supplied to a vertically situated simulated chip board 10 by Spraco Hydraulic atomizing nozzles 14 as illustrated in FIGS. 2(a) and 2(c). A fan 17 was used to supply air for the mist and to increase the mist velocity. The nozzles were located 860 mm away from the chip board and 20.5 mm above the tops of simulated chips 12. Troughs 11 permitted the drainage of any excess fluid.

Chip temperatures were measured at the top of the simulated chip (area 4) and at three of the cavity walls (areas 1, 2, and 3) using thermocouples 18, 20, 22, and 24 as illustrated in FIG. 2(c).

EXAMPLE 1

A water-droplet mist was supplied to the first simulated chip board illustrated in FIGS. 2(a), 2(b) and 2(c). The droplets varied in size from about 30 μm to about 50 μm. The water was fed to the nozzles at a temperature of about 21° C. A water droplet mist flow having a liquid mass concentration of about 0.06 to about 0.08 kg/m³ was applied upwardly across the simulated chip board at a velocity of approximately 10 to 12 meters per second. A thin, continuous liquid film of about 100 μm was formed upon the heated stainless steel strips.

Figure 3:
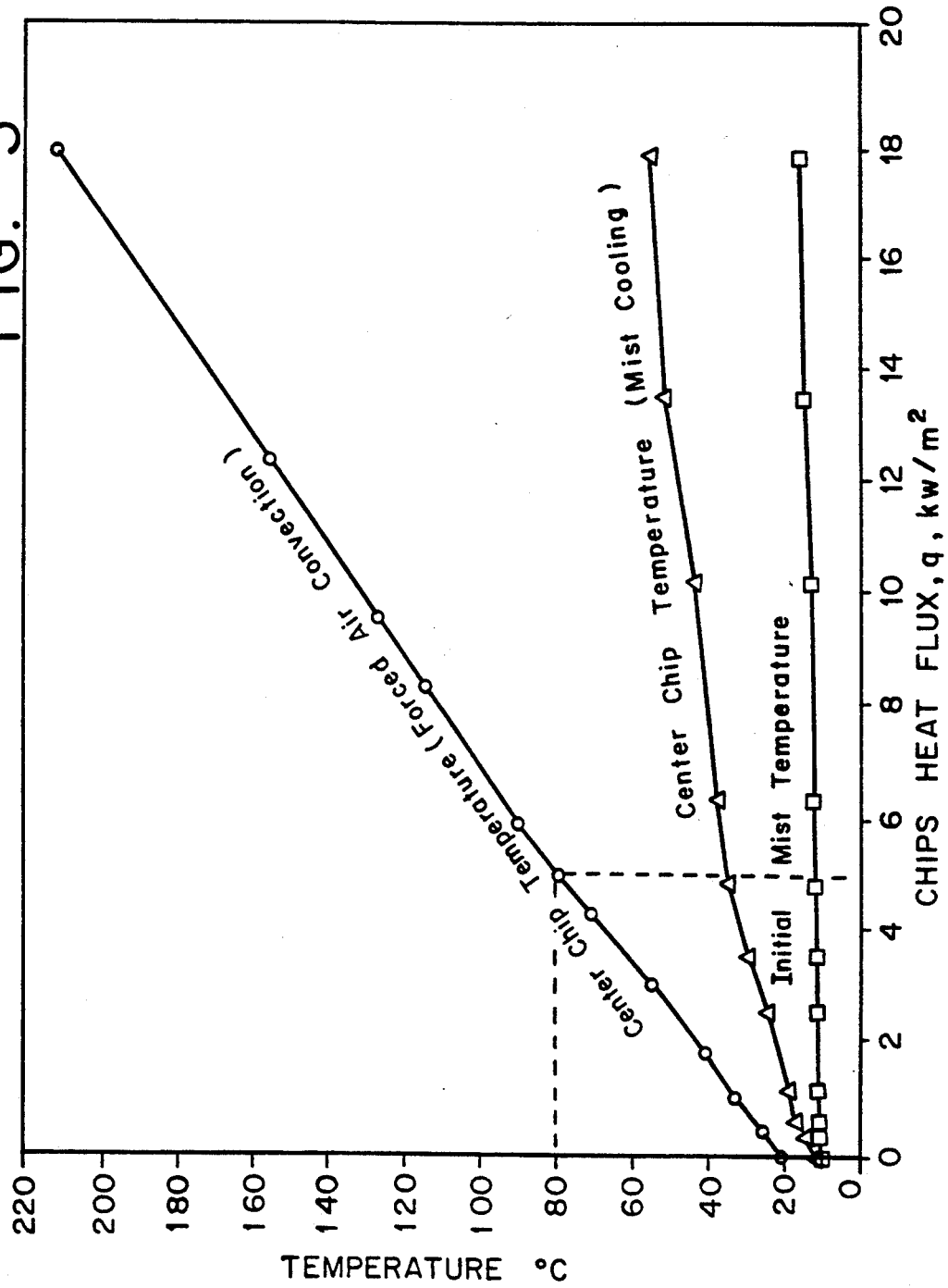
FIG. 3 graphically illustrates the rate of simulated chip heat flux versus surface temperature using water as the coolant.
Figure 4:
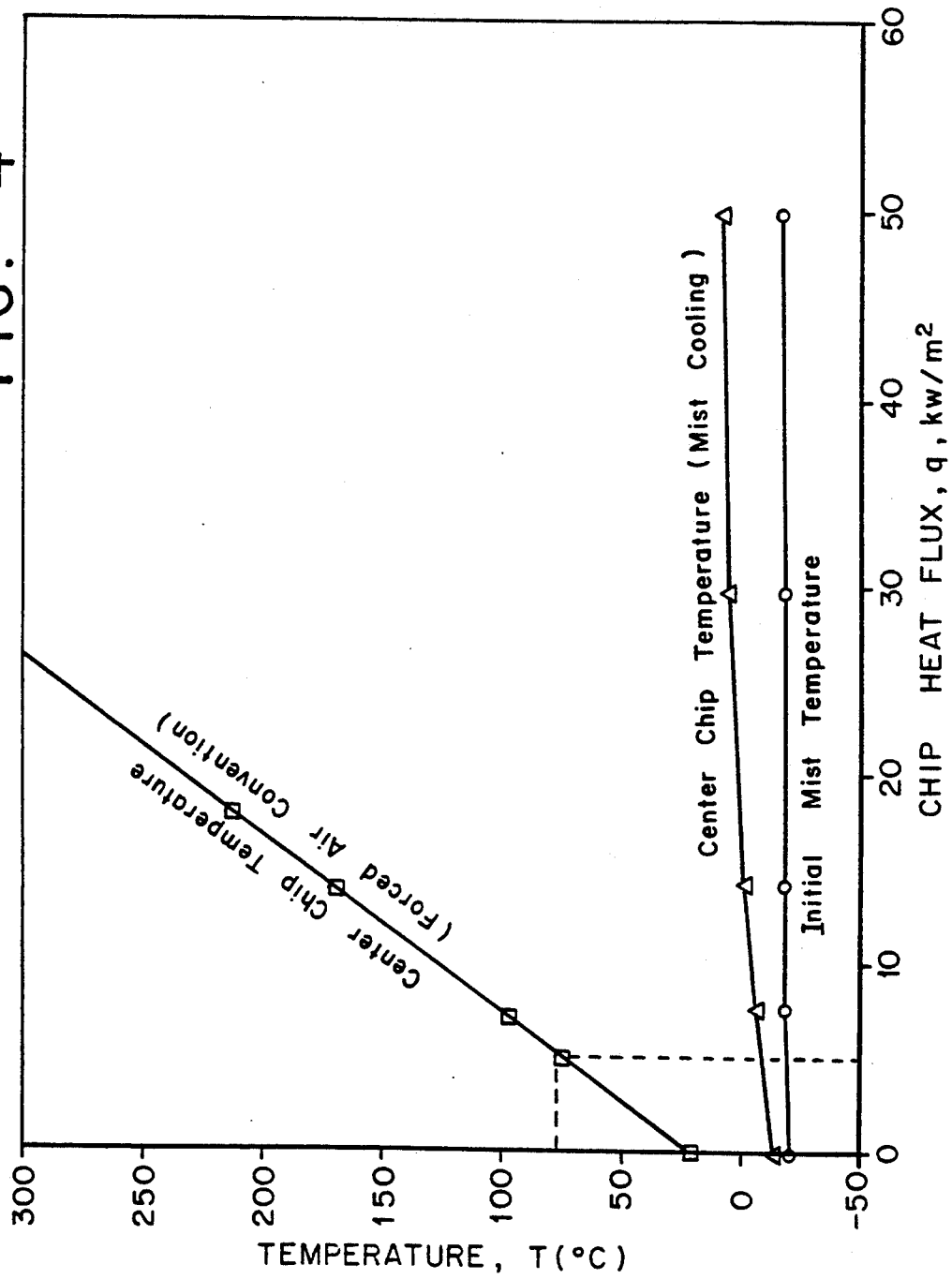
FIG. 4 graphically illustrates the rate of simulated chip heat flux versus chip temperature using trichloromonofluoromethane (Freon-11 TM) as the coolant.

FIG. 3 illustrates the ability of the present invention to remove heat from a simulated computer chip board as measured at area 4 illustrated in FIG. 2(c) at a mist velocity of 10–12 meters per second. Currently, the maximum operating temperature for computer chips is about 80° C. At temperatures of over 80° C., computer chips experience very serious and disabling malfunctions. As shown in FIG. 3, conventional forced air convection can remove heat from area 4 at a maximum flux rate of only about 5 kw/m², while still maintaining a temperature of under 80° C.

FIG. 3 illustrates the ability of the present invention to provide a heat flux rate of 18 kw/m² at a temperature of less than 60° C. (as measured at area 4). Thus, FIG. 3 illustrates the ability of the present invention to provide a high heat flux (18 kw/m²) while simultaneously providing a low surface temperature (50° C.).

EXAMPLE 2

A trichloromonofluoromethane (Freon-11 ™) mist with a droplet size of 30 to 50 μm was applied to the first simulated chip board used in Example 1. The trichloromonofluoromethane was fed to the nozzles at a temperature of 17° C. and the trichloromonofluoromethane droplet mist had a temperature of −13° C. The stainless steel surface layer had been heated to a temperature of approximately 500° C. The trichloromonofluoromethane mist was upwardly applied at a flow velocity of approximately 10 to 12 meters per second and at a droplet liquid mass concentration of approximately 0.06 to 0.08 kg/m³. The droplets were deposited upon the strip at a rate which was approximately the same as the rate of the evaporation of the droplets from the strip. The liquid film was approximately 100 μm thick.

Figure 5:
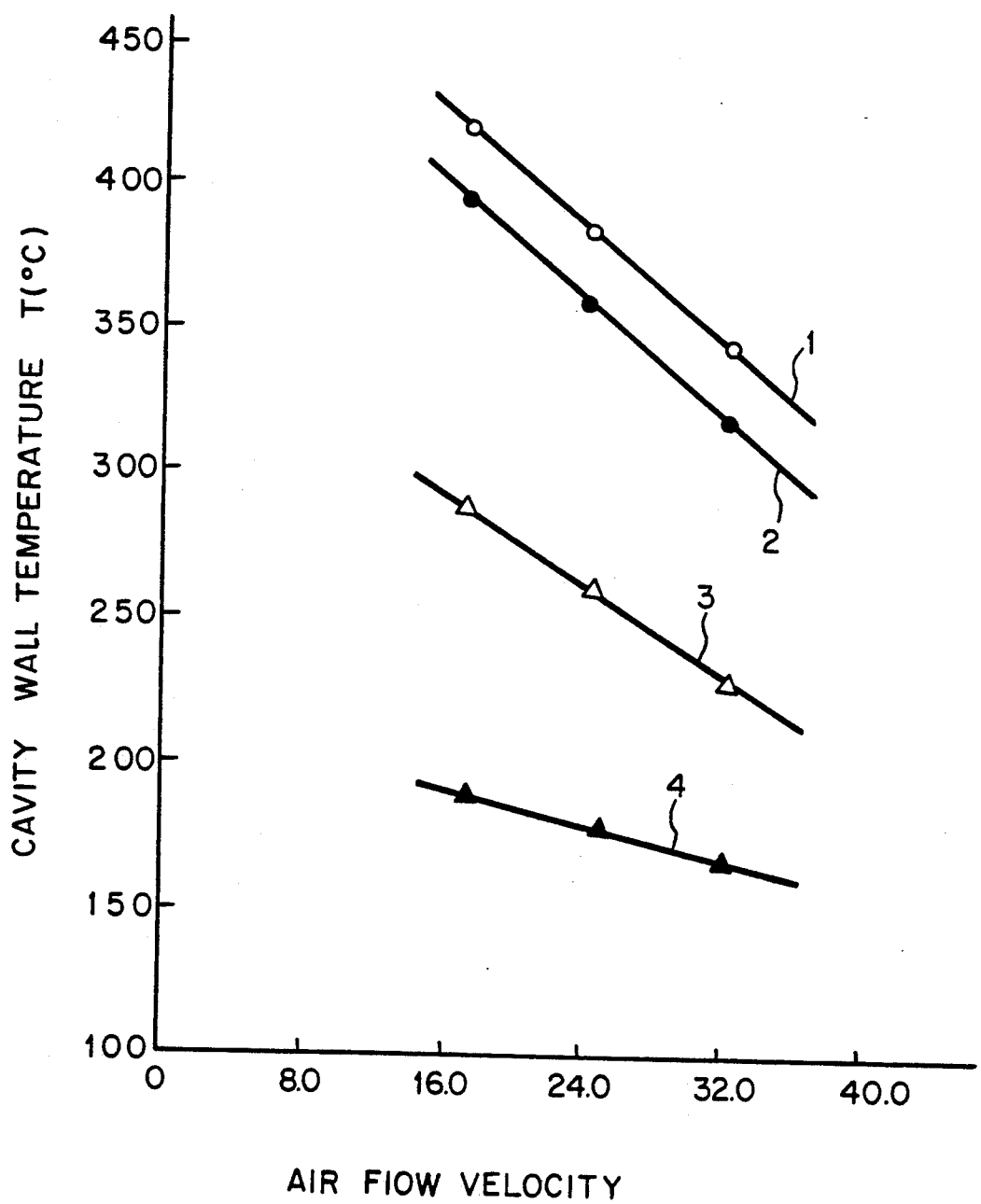
FIG. 5 graphically illustrates simulated chip surface temperatures as a function of air velocity at a constant heat flux of 53.38 kw/m$^2$.

FIG. 5 illustrates the ability of the present invention to remove heat from area 4 of a simulated chip board illustrated in FIG. 2(c) at a mist velocity of about 10–12 meters per second. The maximum operating temperature for computer chips is currently about 80° C. As shown in FIG. 5, at a temperature of 80° C. a maximum heat flux of a mere 5 kw/m² may be achieved using conventional forced air convection cooling. FIG. 5 illustrates the ability of the present invention to provide a center chip temperature (surface 4) of less than 0° C. while simultaneously providing a heat flux of approximately 50 kw/m², an improvement over air convection cooling of approximately 10 fold.

EXAMPLE 3

A second simulated chip board 10 was constructed as illustrated in FIGS. 2(a), 2(b) and 2(c). The dimensions and geometries of the simulated chips 12 closely resemble those of the most commonly used chips. The simulated chips 12 were 23 mm long by 23 mm wide by 14.5 mm deep, and arranged in rows with a chip-to-chip gap of 3 mm and a row-to-row separation of 15 mm. The cavities 13 therebetween had a depth (h) of 14.5 mm and width (b) of 15 mm. The b/h ratio was 15/14.5 or approximately 1.03. The simulated chips 12 rested upon an insulation plate 20. The primary surfaces of the simulated chips 12 were covered by 0.2 mm of stainless steel. The simulated chips 12 were heated by applying an electric current to the stainless steel covering the surfaces of the simulated chips 12. In a preferred embodiment, an insulated container 15 encloses the system.

A coolant mist was upwardly supplied to a vertically-situated simulated chip board 10 by Spraco Hydraulic atomizing nozzles 14 as illustrated in FIGS. 2(a) and 2(c). A fan 17 was used to supply air for the mist and to increase the mist velocity. The nozzles were located 860 mm away from the chip board and 20.5 mm above the tops of simulated chips 12. Troughs 11 permitted the drainage of any excess fluid.

Chip temperatures were measured at the top of the simulated chip (area 4) and at three of the cavity walls (areas 1, 2, and 3) using thermocouples 18, 20, 22, and 24 as illustrated in FIG. 2(c).

Single-phase air convective cooling was applied to the second simulated chip board described above and illustrated in FIGS. 2(a), 2(b) and 2(c). The initial air temperature was about 20° C.

FIG. 5 illustrates the temperature of surfaces 1, 2, 3 and 4 as a function of air flow velocity in a forced-air convection cooling system. A constant heat flux of 53.38 kw/m² was maintained throughout the experiment.

As illustrated in FIG. 5, while the single-phase air convective cooling did lower the temperatures of areas 1, 2, 3 and 4, the temperatures were still very high. The temperature ranged from a low of about 175° C. to a high of about 425° C. As shown, single-phase air convective cooling is an inefficient method for the cooling of computer chips and is not capable of providing a low surface temperature while simultaneously providing a high heat flux.

Figure 6:
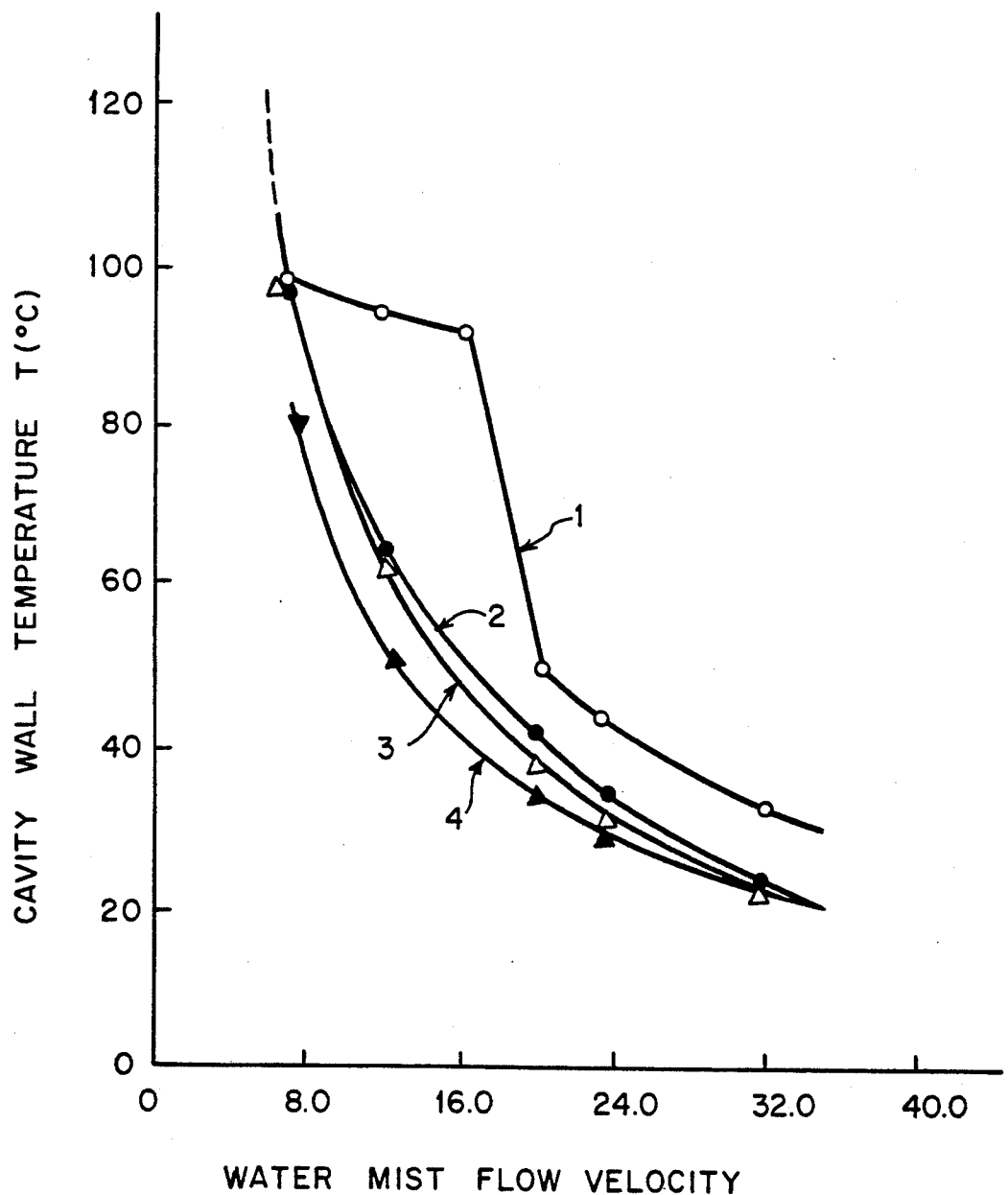
FIG. 6 graphically illustrates simulated chip surface temperatures as a function of water mist velocity at a constant heat flux of 53.38 kw/m$^2$.

FIG. 6 graphically illustrates the change in chip surface temperature as measured at surfaces 1, 2, 3 and 4 as a function of water mist velocity. The heat flux was kept constant at 53.38 kw/m². The droplets had a temperature of about 18° C., were approximately 15 μm in diameter and had a liquid mass concentration of 1.24 kg/³.

As shown in FIG. 6, the temperatures of surfaces 1, 2, 3 and 4 dropped dramatically with an increase in mist velocity. FIG. 6 also illustrates the ability of the present invention to provide a high heat flux coupled with a low surface temperature. For example, at a water mist velocity of 24.0 meters per second and a heat flux of 53.38 kw/m², surfaces 1, 2, 3 and 4 had temperatures of between 25° C. and 40° C.

Figure 7:
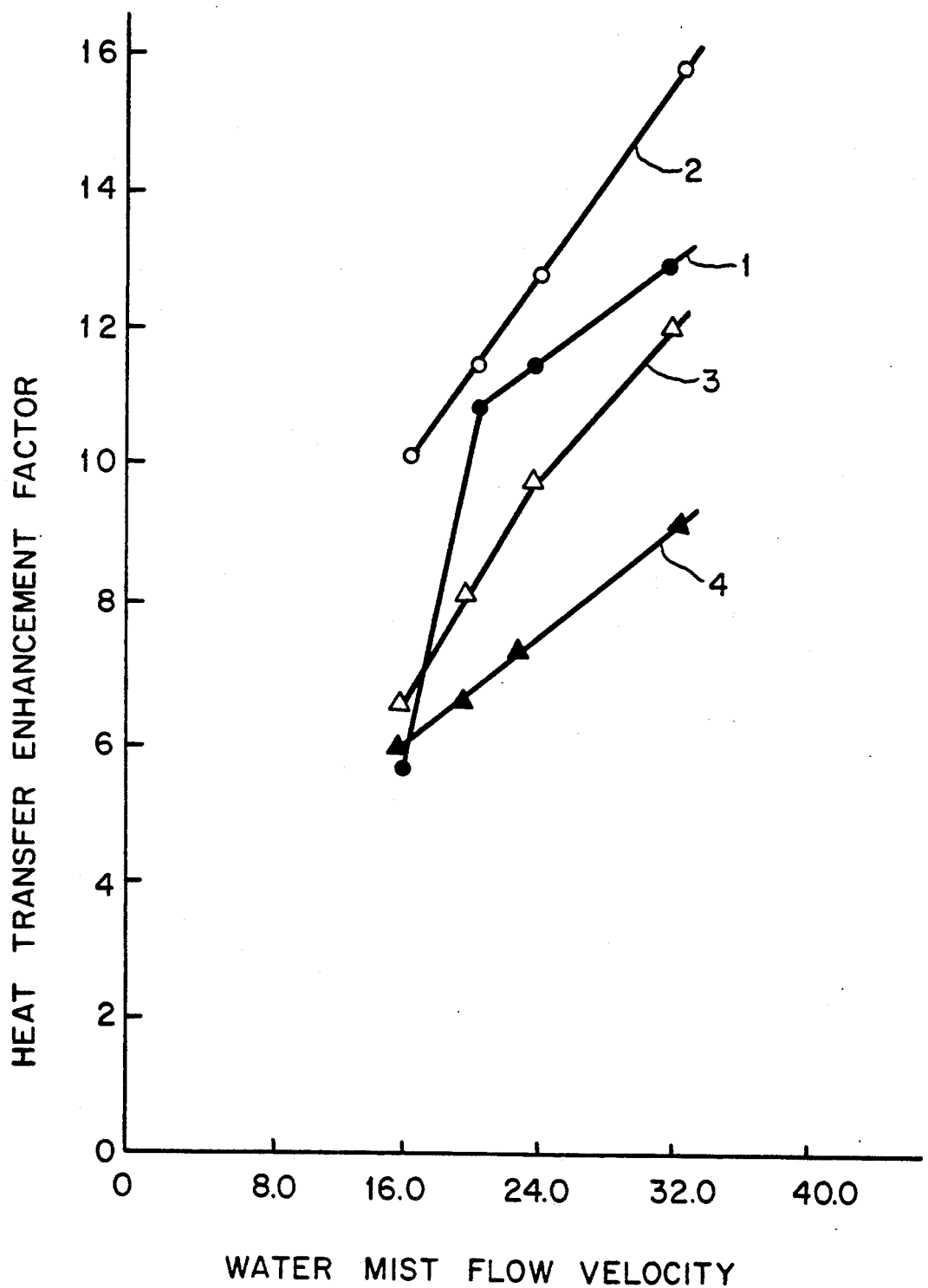
FIG. 7 graphically illustrates the heat transfer Enhancement Factor as a function of water mist velocity at a constant heat flux of 53.38 kw/m$^2$.

FIG. 7 illustrates the heat transfer enhancement factor "E" as a function of mist velocity for various simulated chip board surfaces as measured by thermocouples 18, 20, 22 and 24 at surfaces 1, 2, 3 and 4 at a constant heat flux of 53.38 kw/m², a water droplet mass concentration of 1.24 kg/m³, a droplet diameter of 15 μm and an initial water droplet temperature of 18° C. The heat transfer enhancement factor "E" is a ratio of the heat transfer coefficient for single phase convective air cooling ($h_g$) to the heat transfer coefficient for mist cooling ($h_m$). For example, an E value of 16 would indicate that the heat transfer is 16 times more effective than single-phase air convective cooling under the same conditions.

As shown in FIG. 7 at a mist velocity rate of 32 meters per second, approximately 16 times more heat is removed from surface 2, approximately 13 times more heat is removed from surface 1, approximately 12 times more heat is removed from surface 3 and approximately 9 times as much heat is removed from surface 4 as can be removed from these surfaces using conventional single phase air convective cooling.

FIG. 7 also illustrates that the heat transfer enhancement factor (E) tends to increase as a function of the coolant mist velocity. With respect to surface area the heat transfer enhancement factor increases dramatically when the mist velocity is increased from 16 meters per second to 20 meters per second. This is due to the thinning of a thick film of accumulated excess liquid upon surface 1 by the increased velocity of the vortex in the cavity.

Additional testing using trichloromonofluoromethane (Freon 11 TM) as the coolant resulted in heat fluxes of as high as 300 kw/m$^2$ with a chip surface temperature, at surface 4, of approximately 0° C. The Freon 11 TM droplets were about 60 μm in diameter and the flow velocity was 12 meters per second. The testing was limited by the tendency of the thermocouple solders to melt at high temperatures.

Accordingly, the present invention provides super-cooling for the outside surface of a simulation chip board having a complicated geometry as illustrated in FIGS. 2(a), 2(b) and 2(c). This cooling is a dramatic improvement over the cooling provided by conventional single-phase forced air convective cooling used with most present-day electronic devices. Further, the method of the present invention permits the simultaneous attainment of low surface temperature combined with a high heat flux.

While there have been described what are presently believed to be the preferred embodiments of the invention, those skilled in the art will realize that various changes and modifications may be made to the invention without departing from the spirit of the invention, and it is intended to claim all such changes and modifications as fall within the scope of the invention.

What is claimed is:

1. A method for the cooling of a non-planar surface having at least one cavity which comprises:
   (a) contacting a mist to said surface at a droplet size, liquid mass concentration, velocity and direction to effectively provide a non-pulsed flow at said surface sufficient to form a coolant film on said surface such that at least one vortex is formed within said cavity and said film evaporates from an outside surface of the film thereby cooling said surface.

2. The method of claim 1 wherein said coolant is selected from the group consisting of water, trichloromonofluoromethane and dichlorodifluoromethane.

3. The method of claim 1 wherein said mist consists of droplets ranging in size from about 18 to about 120 μm.

4. The method of claim 1 wherein said mist consists of droplets ranging in size from about 30 to about 80 μm.

5. The method of claim 1 wherein the rate of evaporation of said film is approximately equal to the rate of deposition of said film upon said surface.

6. The method of claim 1 wherein only one vortex is formed within said cavity.

7. The method of claim 1 further comprising;
   (a) cooling said evaporated film;
   (b) forming said cooled evaporated film into a coolant mist; and
   (c) redepositing said coolant mist upon said surface.

8. The method of claim 1 wherein the film has a thickness of from about 10 to about 100 μm.

9. The method of claim 1 wherein the mist contacts the surface at a liquid mass concentration of from about 0.01 kg/$^3$ to about 0.15 kg/$^3$.

10. The method of claim 1 wherein said mist has a velocity of from about 5 to about 30 meters per second.

11. A method for the cooling of a non-planar surface having at least one cavity which comprises:
    (a) contacting a mist to said surface at a droplet size, liquid mass concentration and velocity sufficient to form a coolant film on said surface such that at least one vortex is formed within said cavity and said film evaporates from an outside surface of the film thereby cooling said surface; and
    wherein said mist consists of droplets ranging in size from about 18 to about 120 μm.

12. The method according to claim 11, wherein said mist consists of droplets ranging in size from about 30 to about 80 μm.

* * * * *

UNITED STATES PATENT AND TRADEMARK OFFICE
CERTIFICATE OF CORRECTION

PATENT NO. : 5,311,931
DATED : May 17, 1994
INVENTOR(S) : Richard S. L. Lee

It is certified that error appears in the above-indentified patent and that said Letters Patent is hereby corrected as shown below:

At Column 1, after the title of the invention, please insert -- This invention was made with government support under grant CBT 85-07670 awarded by the NSF. The government has certain rights in this invention.--

Signed and Sealed this

Fifth Day of December, 1995

Attest:

BRUCE LEHMAN

Attesting Officer

Commissioner of Patents and Trademarks